(12) United States Patent
McDonald et al.

(10) Patent No.: US 7,295,582 B2
(45) Date of Patent: Nov. 13, 2007

(54) THERMO-OPTIC TUNABLE LASER APPARATUS

(75) Inventors: Mark E. McDonald, Mill Valley, CA (US); Wei Wang, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 211 days.

(21) Appl. No.: 11/170,893

(22) Filed: Jun. 30, 2005

(65) Prior Publication Data

US 2007/0002926 A1 Jan. 4, 2007

(51) Int. Cl.
*H01S 3/10* (2006.01)
*H01S 3/13* (2006.01)

(52) U.S. Cl. .............................. 372/20; 372/28; 372/32
(58) Field of Classification Search .................. 372/20
See application file for complete search history.

(56) References Cited

U.S. PATENT DOCUMENTS

| | | | |
|---|---|---|---|
| 6,288,804 | B1 | 9/2001 | Daiber et al. |
| 6,658,031 | B2 | 12/2003 | Tuganov et al. |
| 6,665,321 | B1 | 12/2003 | Sochava et al. |
| 6,763,047 | B2 | 7/2004 | Daiber et al. |
| 6,788,724 | B2 | 9/2004 | Sell et al. |
| 6,804,278 | B2 | 10/2004 | Daiber et al. |
| 6,816,323 | B2 | 11/2004 | Colin et al. |
| 6,822,996 | B1 | 11/2004 | Pace et al. |
| 6,845,121 | B2 | 1/2005 | McDonald |
| 6,853,654 | B2 | 2/2005 | McDonald et al. |
| 2002/0136104 | A1 | 9/2002 | Daiber |
| 2002/0172239 | A1 | 11/2002 | McDonald et al. |
| 2003/0007540 | A1 | 1/2003 | Daiber |
| 2003/0012239 | A1 | 1/2003 | Daiber et al. |
| 2003/0016707 | A1 | 1/2003 | McDonald et al. |
| 2005/0078717 | A1 | 4/2005 | Tuganov et al. |

OTHER PUBLICATIONS

Finot, et al. "Automated Optical Packaging Technology for 10 Gb/s Transceivers and its Application to a Low-Cost Full C-Band Tunable Transmitter," Intel Technology Journal 8(2):101-114 (2004).
Herve, et al. "Optical Technologies for Enterprise Networks," Intel Technology Journal 8(2):73-82 (2004).
Hutchinson, et al. "Indium Phosphide-Based Optoelectronic Wavelength Conversion for High-Speed Optical Networks," Intel Technology Journal 82(2):161-171 (2004).

(Continued)

*Primary Examiner*—Armando Rodriguez
(74) *Attorney, Agent, or Firm*—Marshall, Gerstein & Borun LLP

(57) ABSTRACT

Thermo-optic tuning apparatuses and techniques that may be used in external cavity lasers are provided. A wavelength selection device may be placed in the external cavity and may include a thermally responsive substrate and tunable optical elements extending therefrom. Heating and heat monitoring actuators may be formed in the substrate itself, with the tunable optical elements being mechanically positioned in the recesses of the substrate for thermo-optic tuning. In some examples, a separate optical path length adjustment element is also placed in the thermally responsive substrate, or elsewhere, for separate frequency tuning. This adjustment element may be part of a control that is detangled from the normal servo controls used in laser tuning.

23 Claims, 11 Drawing Sheets

OTHER PUBLICATIONS

Kirkpatrick, et al. "10 Gb/s Optical Transceivers: Fundamentals and Emerging Technologies," Intel Technology Journal, 8(2):83-100 (2004).

Kobrinsky, et al. "On-Chip Optical Interconnects," Intel Technology Journal 8(2):129-142 (2004).

Mohammed, et al. "Optical Interconnect System Integration for Ultra-Short-Reach Applications," Intel Technology Journal 8(2):115-128 (2004).

Salib, et al. "Silicon Photonics," Intel Technology Journal 8(2):143-160 (2004).

Time unit =0.05 sec 10.3719, 46.8326
Time : 0.518595

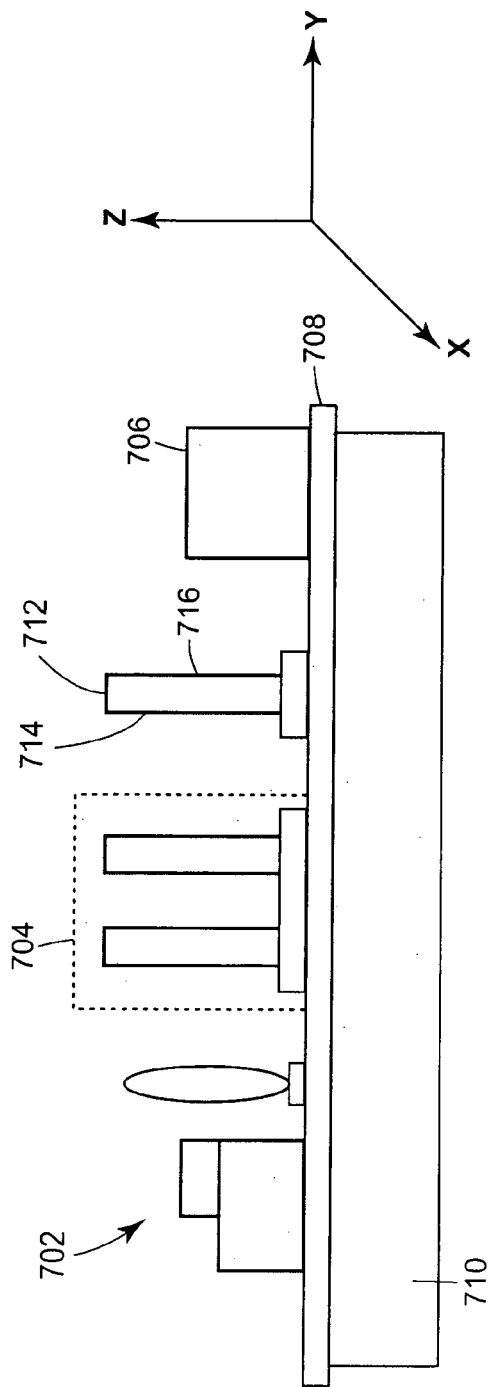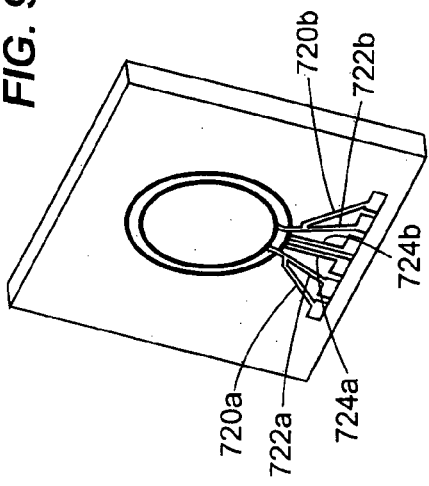

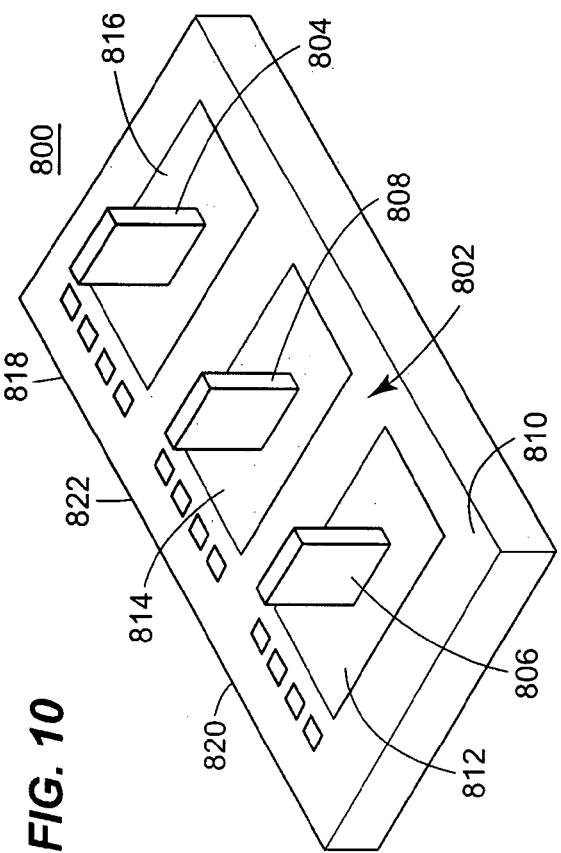
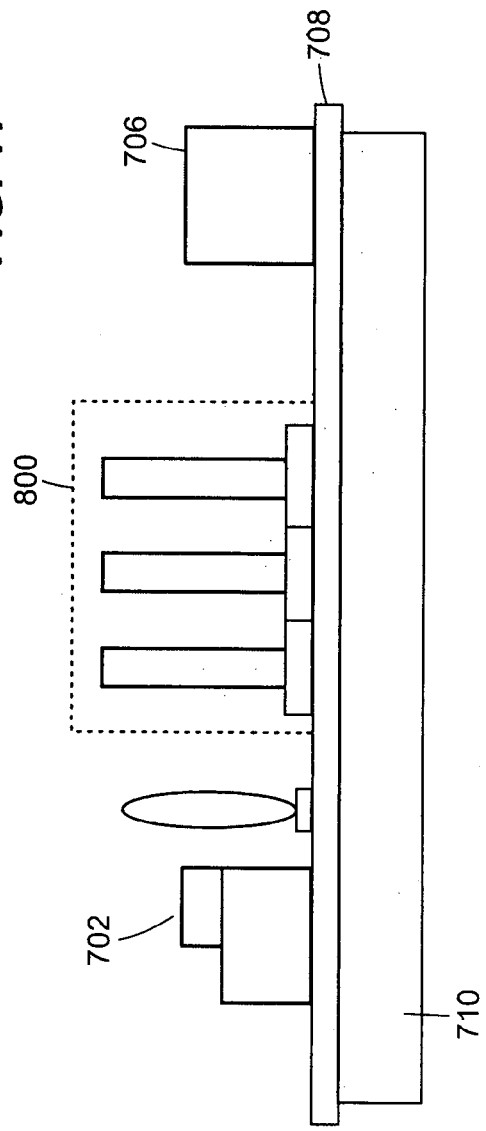
*FIG. 10*
*FIG. 11*

THERMO-OPTIC TUNABLE LASER APPARATUS

FIELD OF THE DISCLOSURE

Embodiments of the present disclosure relate generally to optoelectronic assemblies and, more particularly, to methods and apparatuses for facilitating tuning in a laser apparatus.

BACKGROUND OF RELATED ART

Fiberoptic telecommunications are continually subject to demands for increased bandwidth. One way that bandwidth expansion has been accomplished is through dense wavelength division multiplexing (DWDM). With a DWDM system many different and separate data streams may concurrently exist in a single optical fiber. Each data stream represents a different channel within the optical fiber, where each channel exists at a different channel wavelength. The modulated output beam of a laser operating at the desired channel wavelength creates the data stream. Multiple lasers are used to create multiple data streams, and these data streams are combined onto a single fiber for transmission in their respective channels.

The International Telecommunications Union (ITU) presently requires channel separations of approximately 0.4 nanometers, or about 50 GHz. This channel separation allows up to 128 channels to be carried by a single fiber within the bandwidth range of currently available fibers and fiber amplifiers.

With the requirement for multiple tightly spaced channels, stable control over both the laser source and output frequency is important to system effectiveness. The lasers used in DWDM systems typically have been based on distributed feedback (DFB) lasers operating with a tuning etalon that defines the ITU wavelength grid. Due to manufacturing as well as performance limitations, DFB lasers are used as single channel lasers, or as lasers limited to tuning among a small number of adjacent channels. As a result, DWDM applications would require multiple different DFB lasers each at a different channel wavelength.

Continuously tunable external cavity lasers have been developed to overcome the limitations of DFB lasers. These lasers have a laser source and end mirror that define an external cavity used for wavelength tuning. For example, a tuning element within the external cavity, such as, an etalon device, is mounted to a support that is fixed to a platform extending between the laser source and end mirror. Controlling the temperature of the platform tunes the laser by altering the optical path length of the external cavity. Separate tuning between grid wavelengths may also be achieved by separately tuning the tuning element.

While such lasers have been used with some success, continuously tunable telecommunication lasers do present some design considerations. These lasers can be somewhat expensive and time consuming to manufacture. In particular, the tuning assemblies used in many continuously tunable lasers result from a lengthy sequential build-up process. During this process, certain components can only be fabricated after other components have been completed. Furthermore, once fabricated, the tuning speed of continuously tunable lasers is limited by the type of tuning method used in the assembly. More specifically, many current tuning methods require adjustment of multiple interdependent systems, which adds to control complexity and prolonged tuning times.

BRIEF DESCRIPTION OF THE DRAWINGS

FIG. 8 illustrates an alternative tunable laser apparatus that includes an active optical path length adjustment device that may be used for frequency tuning;

FIG. 9 illustrates a detailed example of the optical path length adjustment device of FIG. 8;

FIG. 10 illustrates a detailed example of another optical path length adjustment device, combined with an wavelength selection component;

FIG. 11 illustrates a laser apparatus employing the configuration of FIG. 10.

DETAILED DESCRIPTION OF AN EXAMPLE

Figure 1:
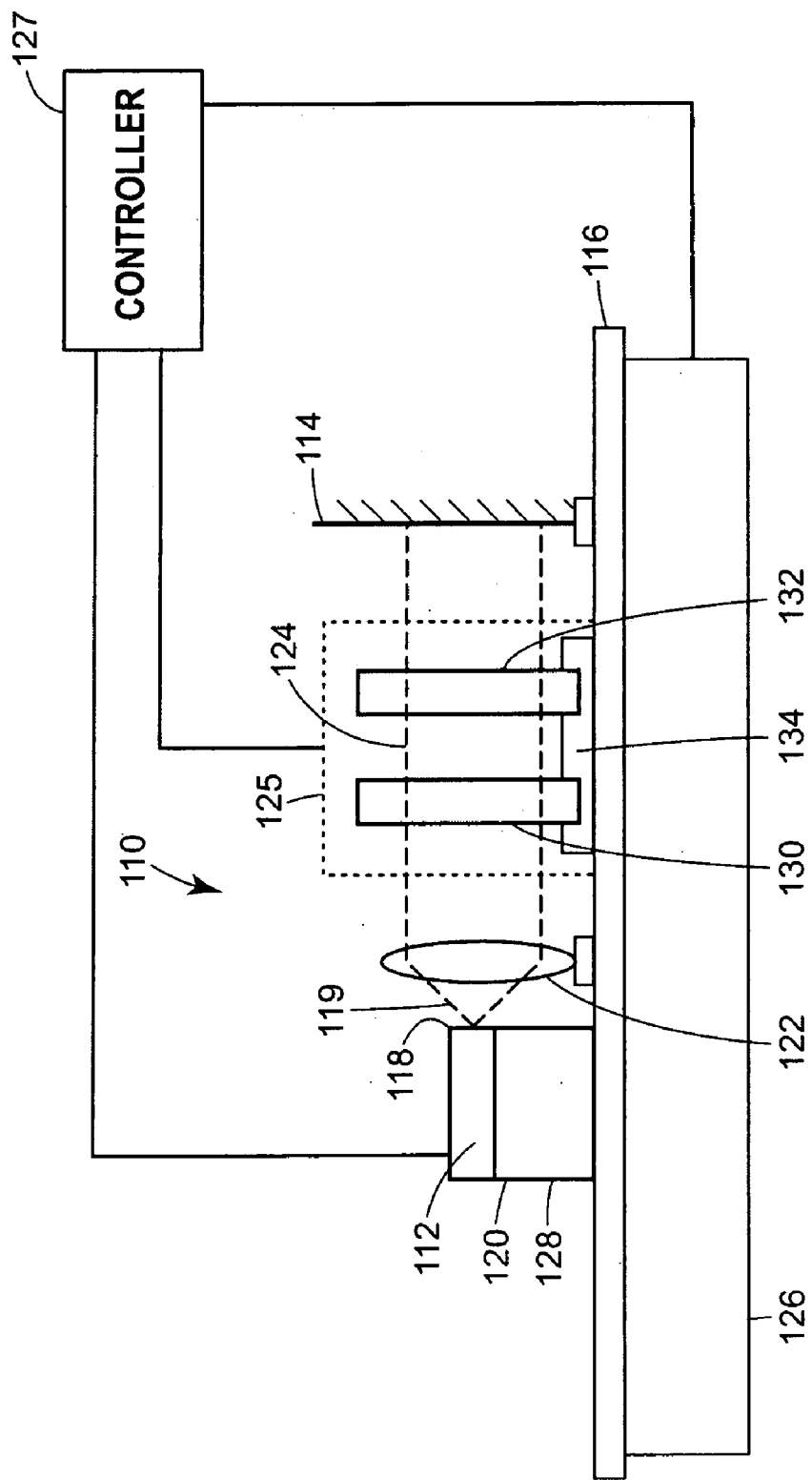
FIG. 1 illustrates a side view of a tunable laser apparatus with a wavelength selection device in accordance with an example.

Example embodiments provide laser apparatuses and methods that use thermo-optic adjustment of an external laser cavity to provide wavelength stability and wavelength, or frequency, tuning. The laser apparatuses may include a gain medium coupled to a platform, the gain medium having an emitting facet for emitting a first light beam toward the external laser cavity. The external laser cavity may have a wavelength selection device for tuning the output wavelength of the laser apparatus, for example, the channel wavelength in a DWDM system. The external laser cavity, for example, may be mounted on a thermally adjustable substrate, where the responsiveness of the substrate may be controlled by a thermal control element and where thermal adjustments to the external cavity may be used to tune the laser apparatus. Although described below in certain example implementations, the wavelength selection component may comprise one or more etalons, gratings, prisms, filters or like devices, or various combinations thereof and may be tunable mechanically, electrically, thermally, or by other mechanism to provide wavelength selective feedback to the gain medium.

The wavelength selection component may be achieved via a hybridized device that includes a thermally responsive substrate with integrally mounted wavelength selection elements. The substrate may comprise a thermally conductive material to provide good thermal transfer to, and rapid temperature change of, the wavelength selection elements and other components in the external cavity thermally coupled to the substrate. Both the thermally responsive substrate and the wavelength selection elements may be simultaneously fabricated using known semiconductor processing to reduce overall assembly times. Both the substrate and the wavelength selection elements may be batched fabricated on semiconductor wafers, for example.

Some further examples of the laser apparatus may comprise a separate external cavity optical path length control device positioned in the light beam between the gain medium and the end reflector. The path length control device may be an active optical element positioned to provide independent frequency tuning for the laser apparatus. For example, the optical path length control device may be made of a thermally responsive optical material that changes in the refractive index under temperature variations. Unlike conventional passive optical path length control which relies on the laser apparatus's thermal tuning system, the optical path length control device may be independently controllable, detuning this control from the bulkier and slower laser apparatus's thermal tuning system that tunes an entire laser platform. The external cavity optical path length control, therefore, may be part of a faster, independent servo control for frequency tuning.

Although, various techniques are described in reference to particular illustrated examples, the descriptions are not limited to these examples. Further, while drawings are provided for illustration purposes, it is noted that the apparatuses may vary as to configuration and as to details of the parts, and that the methods may vary as to details and the order of events, without departing from the basic concepts as disclosed herein. Furthermore, although examples are disclosed primarily in an external cavity laser, the examples are not limited thereto. The relative sizes of components and distances therebetween as shown in the drawings may be exaggerated in some instances for reason of clarity, and should not be considered limiting. Further, any definitions herein are provided for reason of clarity, and should not be considered as limiting, and any technical and scientific terms used herein are intended to have the same meaning as commonly understood by those skilled in the art. It should also be understood that the terminology used herein is for the purpose of describing particular embodiments only, and is not intended to be limiting, since the scope of the present invention will be limited only by the appended claims.

FIG. 1 shows a laser apparatus 110 that employs thermal control of external cavity optical path length and frequency tuning. The apparatus 110 includes a gain medium 112 and a reflective element 114, such as an end mirror, coupled to a thermally conductive base, substrate or platform 116. The gain medium 112 may comprise, for example, a conventional Fabry-Perot diode emitter chip with an anti-reflection (AR) coated facet 118 and a partially reflective facet 120. Reflective element 114 may comprise a mirror, grating, prism or other reflector or retroreflector. The external laser cavity is delineated by facet 120 and reflective element 114, and has an optical path length. Gain medium 112 emits a light beam 119 from facet 118 that is collimated by lens 122 to define an optical path 124. Beam 119 is reflected from end reflector 114 and returned along path 124 and is returned to gain medium by the lens 122. A wavelength selection device 125 is positioned in the path 124 to feed back light to gain medium 112 at a selected wavelength. The end mirror 114 may be curved in certain embodiments such that lens 122 may be omitted. Other alternatives will be apparent to persons skilled in the art, including for example the use of a toric lens system or other optical element(s) capable of re-imaging the returning beam 119 onto facet 118, so that gain medium 112 receives feedback from the external cavity, in place of lens 122.

The wavelength selection device 125 is mounted to the platform 116, which is coupled to a thermal control device such as a thermoelectric controller (TEC) 126, which controls the temperature of the entire platform 116 via thermal conduction. The TEC 126 therefore may be used to control the temperature of the platform 116 for temperature tuning of the components of the apparatus 110, where such temperature tuning may be used to adjust the optical path length of the laser apparatus 110.

The thermally conductive platform 116 may be made from any thermally conductive material. Various metals, metal nitrides, carbides and oxides, or alloys, blends, mixtures or composites thereof, can provide materials with good thermal conductivity and relatively low coefficient of thermal expansion (CTE). Aluminum nitride (AlN) may be used as the platform material in certain embodiments. The material of platform 116 may be selected to have a particular CTE that allows CTE matching to components mounted on platform 116. In some embodiments, platform 116 may comprise a high CTE material, such as aluminum, copper, zinc or other metal or metal alloy, so that a desired amount of physical expansion and contraction according to temperature control of the TEC 126 may occur. A controller 127 may control operation of the TEC 126. The platform 116 may in certain embodiments be made of silicon, allowing CTE matching to silicon components such as thermally tuned etalons. The use of silicon for platform 116 also allows for the integration of conductor paths directly onto the platform 116, and formation of specific geometries on platform 116 using conventional silicon machining and fabrication techniques.

The gain medium 112 is thermally coupled to platform 116 such that thermoelectric controller 126 can control the temperature of gain medium 112 by thermal conduction through platform 116. "Thermally coupling" as used herein means any mounting or coupling arrangement or configuration that provides effective heat flow for thermal control of thermally coupled components. Gain medium 112 is mounted on a thermally conductive carrier 128, which in turn is coupled to platform 116. Gain medium 112 thus is thermally coupled to platform 116 through carrier 128. Carrier 128, like platform 116, may comprise a thermally conductive material such as a metal, metal oxide, metal nitride, metal carbide, or alloys, blends, mixtures or composites thereof. In other examples, and by way of example not limitation, the carrier 128 may comprises aluminum nitride, silicon carbide, or a silicon carbide blend (alloy). In yet other examples, carrier 128 may comprise a copper tungsten (CuW) alloy. Further still, the substrate 116 and carrier 128 may be matched in CTE to each other and to gain medium 112. Thermally conductive adhesives or solders may be used to mount gain medium 112 onto carrier 128, and to mount carrier 128 and/or other various structures onto the platform 116.

The reflective element 114 may also be mounted on platform 116 as noted above and may, in certain embodiments, be thermally coupled to platform 116 using thermally conductive adhesives, solders and/or carriers or supports. The reflector 114 may be subject to temperature control during laser operation, but this is not required. A reflector may be mounted on platform 116 without thermal coupling thereto.

In addition to the overall frequency tuning via TEC 126, in the illustrated example, the wavelength selection device 125 is separately tunable. The wavelength selection device 125, for example, may include two optical elements in the form of etalons 130 and 132 extending from a thermally responsive substrate 134 mounted to the platform 116. This configuration is illustrated by way of example. The wavelength selection device 125 may comprise one or more optical elements, including for example etalons, gratings, prisms or other elements capable of providing feedback to gain medium 112 or otherwise useful in tuning an external laser cavity. The wavelength selection device 125 is shown positioned in optical path 119 between gain medium 112 and end reflector 114. The wavelength selection device 125 may be tunable such that the apparatus 110 has a single transmission peak within a wavelength range of interest such as, for example, the gain bandwidth of gain medium 124, the wavelength range of the ITU (International Telecommunications Union) "C" band (approximately 192.1 THz to approximately 196.1 THz or approximately 1525 to approximately 1565 nanometers), or other wavelength range.

In addition to controlling the gain medium 112, the controller 127, or other control element, may control the wavelength selection device 125, e.g., by operative coupling to wavelength selection device 125 to provide for adjustment or selection of the wavelength of the transmission peak defined by wavelength selection device 125, and, hence the wavelength of light that is fed back to gain medium 112. Example control elements, and other examples of some of the illustrated features are also described in U.S. Pat. No. 6,763,047, which is incorporated herein by reference.

Figure 2:
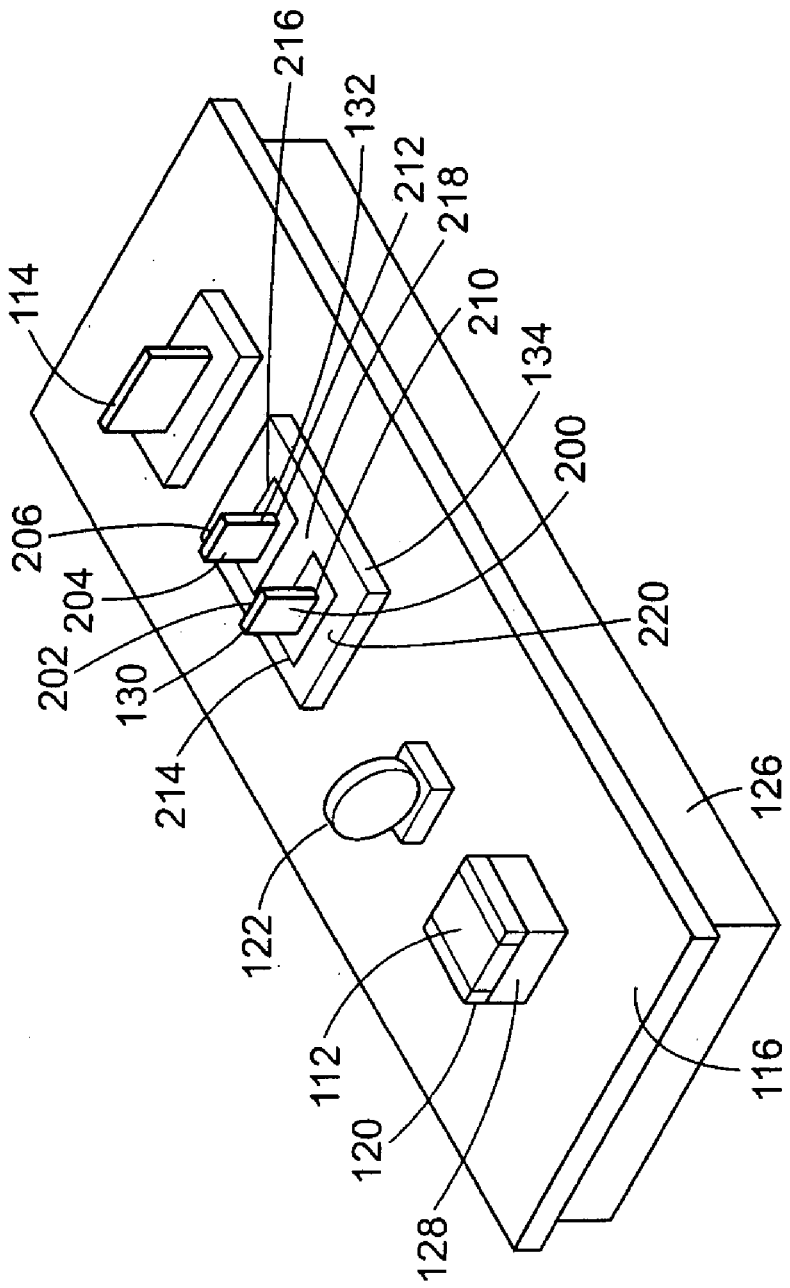
FIG. 2 illustrates a perspective view of an example wavelength selection device in the form of thermally tunable etalons mounted in a substrate.

FIG. 2 illustrates the apparatus 110 with a more detailed illustration of an example implementation of the wavelength selection device 125. In the illustrated example, the wavelength selection device 125 includes the first and second tunable etalons 130 and 132 each positioned within an external cavity defined by an end mirror 114 and the facet 120. The etalons 130, 132 may operate together to preferentially feed back light of a selected wavelength to gain medium 112 during operation of the laser apparatus 110. The etalons 130, 132 are shown in the form of first and second tunable Fabry-Perot etalons, which may comprise parallel plate solid, liquid or gas spaced etalons, and which may be tuned by precise dimensioning of the optical thickness or path length. The etalons 130, 132 are illustrated by way of example. Fewer, additional and/or other optical elements may be used in the wavelength selection device 125, such as for example, a grating, prism, thin film interference filter, or other tunable element.

The first etalon 130 includes faces 200, 202, and has a first free spectral range (FSR) according to the spacing between faces 200, 202 and the refractive index. Second etalon 132 includes faces 204, 206, and has a second FSR according to the spacing between faces 204, 206 and the refractive index of the material of etalon 132. The etalons 130, 132 may comprise the same material or different materials with different refractive indices. Further, the etalons 130, 132 may be tunable by adjustment of their optical thickness, to provide for adjustment or tuning of the FSR of each, which in turn provides selective wavelength tuning for the laser apparatus 110 as described further below. Tuning of etalons 130, 132 can involve adjustment of the distance between faces 200, 202 and 204, 206 of etalons 130, 132 respectively and/or adjustment of the refractive index of the etalon material. Various tuning mechanisms involving various techniques may be used, including thermo-optic, electro-optic, acousto-optic, piezo-optic, mechanical, or other tuning to vary refractive index of etalon material and/or vary the spacing of etalon faces. And more than one such tuning effect may be applied simultaneously to one or both etalons 130, 132, depending upon the particular embodiment of the invention.

In the illustrated example, the etalons 130, 132 each are thermo-optically tunable, where the term "thermo-optic" tuning means tuning by temperature-induced change in etalon material refractive index, temperature induced change in the physical thickness of an etalon, or both.

To thermo-optically tune the etalons 130, 132 separately from TEC tuning, each are disposed in or on the thermally responsive substrate 134. In the illustrated example, etalon 130 is mounted in a first recess 210 in the substrate 134, while the etalon 132 is mounted in a second recess 212. In the illustrated example, the first recess 210 is positioned within a first heating region 214 and the second recess is positioned in a separate heating region 216. In this example configuration, each of the etalons 130, 132 may be separately thermo-optically tuned by separately controlling the heating within the regions 214 and 216. To facilitate thermal isolation between the two regions 214, 216, a thermal barrier 218 separates the regions, thereby acting as a thermal ground to a heat sink, platform 116, or other mounting substrate upon which the device 125 may be engaged during operation. The thickness and composition of the barrier may be adjusted to affect the desired isolation to thereby provide sufficient thermal cross-talk isolation. In the illustrated example, each recess the heating region 214, 216 is formed within the substrate 134 such that the entire substrate 134 surrounds these regions with a thermal ground boundary 220 of which the barrier 218 is grounded thereto.

The illustrated configuration shows a hybrid wavelength selection component assembly, in which the active tuning structure, the substrate 134, is separated from tuned elements, the etalons 130, 132. This may have the advantage over conventional techniques of allowing simultaneous processing of the two structures, thereby reducing fabrication and assembly times over monolithic build-up assemblies. The etalons 130, 132 may be batch fabricated on one wafer and the substrates 134 may be batch fabricated on a different wafer, although alternatively sets of each may be fabricated together on a single wafer. The substrate 134 may be formed from known techniques, including silicon etching and growth processing techniques like hydrofluoric acid (HFC) fabrication, where a glass substrate is direct written with a laser scan across the substrate 134, exposed to ultraviolet light, and then exposed to an acid wash to remove the non-patterned areas and leave the recesses 210, 212. In some examples, the substrate 134 is formed of a material having sufficient thermal properties to allow for uniform and time responsive heating, while being mechanically strong enough to withstand an assembly process that mounts the etalons 130, 132 to the substrate 134.

The etalon materials used in certain embodiments have temperature dependent refractive indices as well as coefficients of thermal expansion such that thermo-optic tuning involves simultaneous thermal control of etalon material refractive index as well as thermal control of etalon physical thickness by selective heating or cooling. Semiconductor materials such as silicon and gallium arsenide provide a large change in refractive index with temperature and may be used for the material etalons for effective thermo-optic tuning. In some examples, the etalons 130, 132 may comprise silicon, which is transparent over the gain bandwidth or output wavelength range of InGaAs, InGaAsP and other gain media. Other materials include liquid crystal polymers (LCPs), or materials formed of inert, no-hydroscopic materials. The etalons 130, 132 may be formed of the same or different materials from that of the substrate 134. In many examples, the materials used in each would have similar or identical thermal expansion coefficients. With the substrate 134 and etalons 130, 132 formed, and by way of example, not limitation, the wavelength selection component 125 may be formed by using a pick-and-place assembly process that mounts the etalons 130, 132 into the recesses 210, 212, respectively. Once mounted, the etalons 130, 132 may be affixed in place by any epoxy, solder, or other adhesive.

Figure 3:
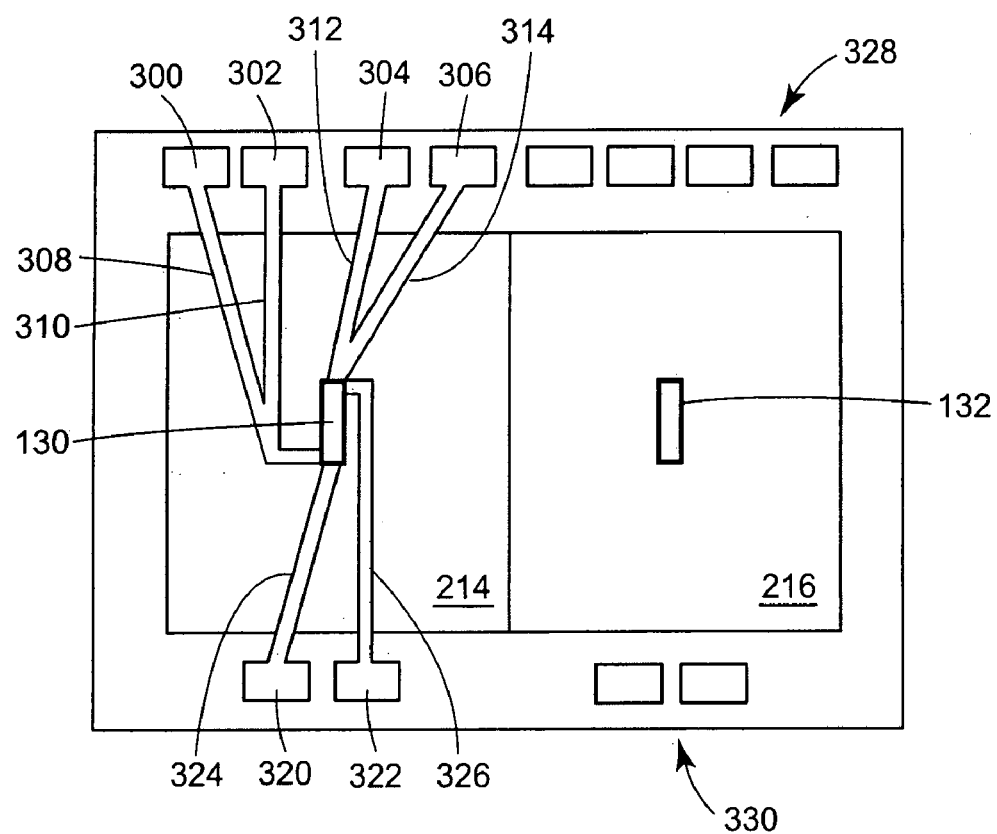
FIG. 3 illustrates a top view of an example thermal heating and sensing configuration for the device of FIG. 2.

The substrate 134 may be controlled by a controller such as the controller 127, e.g., a conventional data processor, and provides tuning signals to device 125 for thermal adjustment or tuning of etalons 130, 132 according to selectable wavelength information stored in a look-up table or other wavelength selection criteria. The substrate 134 may include both heating and thermal monitoring elements, for example, in the form of a heater and a resistive thermal device (RTD) that is used to monitor temperature conditions on or within the substrate 134, examples of which are shown and discussed in reference to FIGS. 3 and 4. These elements may be operatively coupled to the controller, via wire bond pads as shown in FIG. 3 for example.

For the illustrated example, four wire bond pads 300-306 are used to monitor heat in region 214, with wire bond pads 300 and 302 coupled to monitoring leads 308 and 310, respectively, and wire bond pads 304 and 306 coupled to monitoring element leads 312 and 314, respectively. The element leads 308-314 are shown by way of example. One pair (e.g., input/output pads 300 and 306) may be used to carry constant current, while the other input/output pair (e.g., pads 302 and 304) may be used to probe a voltage drop or change. The monitored data may be provided to the controller to calibrate the tuning operation of the laser or as part of the servo control of the tuning operation.

While the wire bond pads 300-306 are used in monitoring, wire bond pads 320 and 322 are used to form a heater for thermo-optic tuning. The bond pads 320 and 322 are coupled to heating elements 324 and 326, respectively, for uniform heating. The heating elements 324 and 326, for example, may be patterned to affect uniform temperature changes for the etalon 130. Though not discussed in detail, the etalon 132 may have similar monitoring and heating wire bond regions 328 and 330, with accompany elements. To save a bond pad, or pin, and reduce electric circuit complexity, the constant current output pad (e.g., pad 306) may be shortened to the input for the constant current pad for the second temperature controlled region, i.e., for etalon 132 in FIG. 3.

Figure 4:
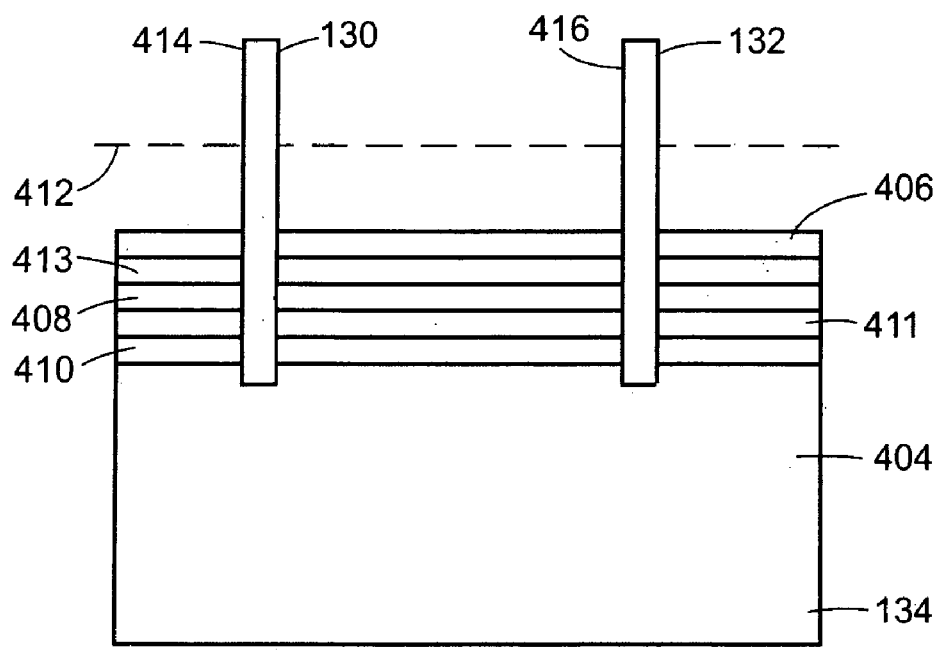
FIG. 4 illustrates a cross-section of the device in FIG. 3 exposing a heating layer and a monitoring layer.

FIG. 4 illustrates an example implementation of a heater 400 and an RTD 402, each disposed in different plane within the substrate 134. During a fabrication process, the substrate 134 may be formed with a device layer 404, membrane outer layer 406, a monitoring layer 408 and a heating layer 410. The device layer 404 may be formed of silicon and the membrane layer a silicon composition, such as $SiN_4$, for example. The monitoring layer 408 may be within a monitoring plane (XY-plane) that is parallel to an optical axis 412. The monitoring layer 408 may include the RTD leads 308, 310, 312, and 314. In the illustrated example, a dielectric passivating layer 411 is formed between the monitoring layer 408 and the heating layer 410. Also, in the illustrated example, a second dielectric passivating layer 413 is formed above the monitoring layer 408. The heating layer 410 may be within a heating plane that is parallel to the optical axis 412, where it will be understood that the heating effects of the heating layer 410 are not limited to this plane, but would extend above and below this plane, for example, through the entire range of the optical element mounting recesses. The heating layer 410 may include the heating element leads 324 and 326. The planes for the heating layer 410 and monitor layer 408 are substantially parallel to the optical axis 412, but substantially perpendicular to the incidence planes containing faces 414, 416 respectively of elements 130, 132. Each layer may be formed of silicon and separately grown and patterned with gold, tin or other material forming the leads traces in that layer. Although the illustrated example shows the monitoring and heating layers in a particular orientation, and embedded below an outer surface of the substrate 134, the orientations may be different. Further, additional or fewer layers may be used for thermal or optical purposes.

The configurations in FIGS. 1-4 show examples of thermo-optically tunable elements, where tunable elements (e.g., etalon) may be tuned in parallel (both etalons heated or cooled at substantially the same rate of temperature change) as well as differentially (etalons are heated or cooled at a substantially different rate of temperature change) for wavelength tuning. Although different tunable elements may operate differently, etalons provide selective wavelength tuning via a Vernier effect. With Vernier tuning, etalons each define a plurality of transmission peaks which operate together to create a single transmission peak within a wavelength range according to the joint effect of etalons. The location of this single, joint transmission peak is adjustable by thermo-optic tuning of one or both etalons through the thermally responsive substrate integrally formed therewith. The use of Vernier tuning with two or more tunable etalons in a device has the advantage of allowing thermo-optic tuning for wavelength selection over a smaller operating temperature range than is possible using a single tunable etalon. This lower overall operating temperature reduces undesirable convective effects, reduces power consumption, and avoids temperature dispersion effects that arise in many etalon materials when the materials are heated or cooled over larger temperature ranges. Such dispersion may arise from varying material thermo-optic coefficients, stress or strain induced by variation of material coefficient of thermal expansion, and liberation of thermally excited free carriers at elevated temperatures. Thermo-optic tuning of a single semiconductor etalon element, for example, can provide wavelength tuning over only a limited wavelength range due to the large temperature range required, as the high temperatures needed for tuning results in excessive losses due to thermally excited free carriers in the etalon.

The substrate 134 may be adjusted to form an operable thermal responsiveness that evenly heats the etalons, or other tunable elements, and that has sufficient thermal responsiveness to perform such heating at relatively low power requirements. The materials and dimensions of the substrates 134, for example, may be formed of materials having relatively small thermal expansion coefficients to allow for more uniform heating. The use of materials with low CTEs may avoid strain in the joint between substrate and etalon. Otherwise, strain can manifest as a non-uniform optical path length across the aperture of the etalon, and, if sufficiently high, can lead to unreliability of the joint over the lift of the product. Additionally, the material may be one that has a good thermal response, by way of example not limitation, a response of greater than 1200 K per input Watt of electrical power to the heating element leads. A 25 µm thick substrate, along the Z-axis, for example, may be heated to 70° C. using only 50 mW of input power, thereby resulting in a thermal responsiveness of 3400 K/Watts. Similar conditions for a 100 µm thick substrate could result in a 2650 K/Watt thermal responsiveness, again by way of example. Thus, the substrates 314 and 500 may be formed to operate within the 1 Watt box power usage requirement for some tunable laser devices.

EXAMPLE I

Figure 5A:
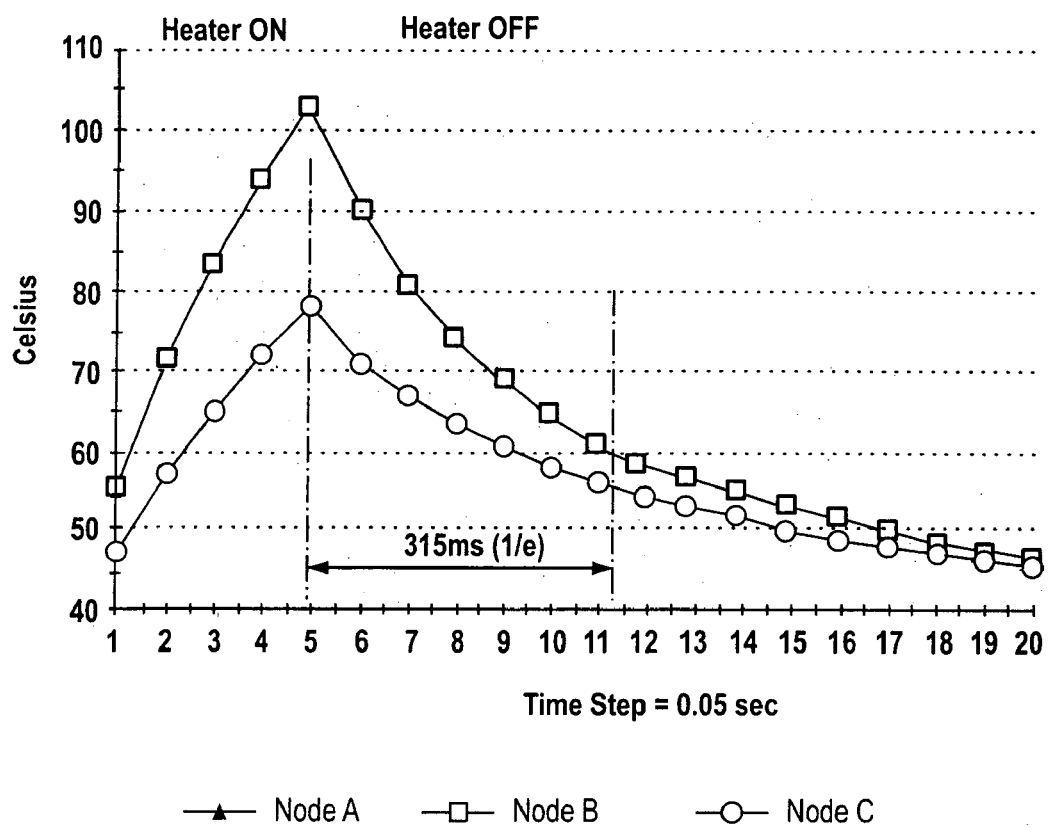
FIG. 5A illustrates a plot of the transient behavior of thermal heating and cooling at different locations on an example wavelength selection device.
Figure 5B:
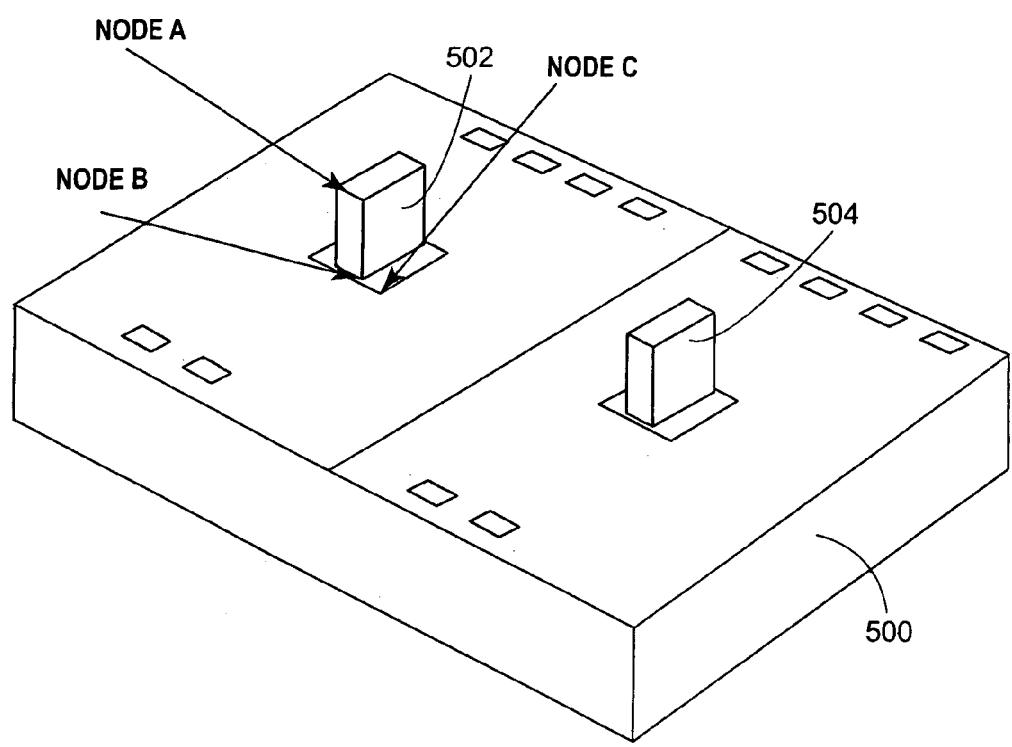
FIG. 5B illustrates the different locations measured for the plot of FIG. 5A.

FIG. 5A provides an example response plot for thermal heating and cooling of an example substrate 500 with first and second etalons 502 and 504 (FIG. 5B). For 100 μm thick substrate, and a starting temperature of 35° C., a 0.25 sec ramp up to 100° C. at a node B, the thermal heating experienced by etalon 502, at the different sensor nodes A, B, C (or measurement locations), is as shown. The thermal time constant, or 1/e relaxation from substrate heating, is approximately 315 ms in the illustrated example.

EXAMPLE II

Figure 6:
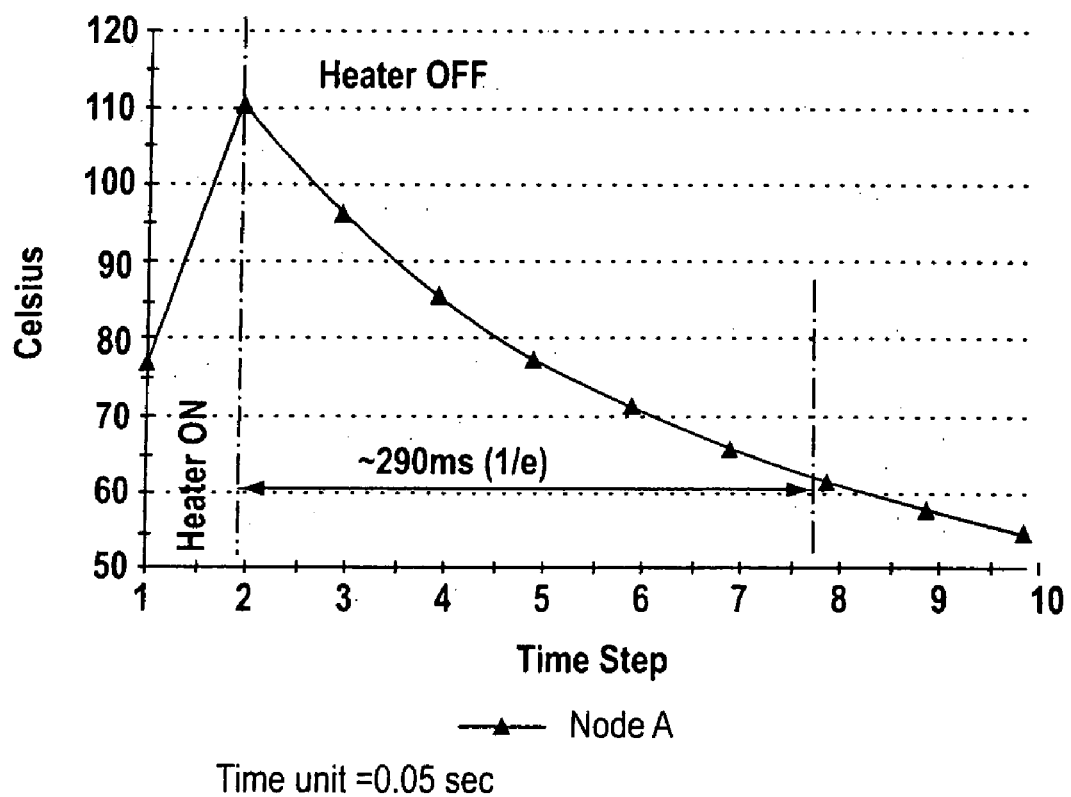
FIG. 6 illustrates a transient behavior of thermal heating and cooling in accordance with another example.

FIG. 6 shows another example thermal response for an implementation of a wavelength selection component. In the example of a 25 μm thick substrate, heating the substrate for 0.1 seconds until a node A (at the top of the etalon) reaches 110° C., the thermal time constant may be approximately 290 ms.

The illustrated data is provided by way of example and shows suitably fast response times for the configuration wavelength selection device. Thermal time constants below 100 ms are achievable, which is sufficient to allow for fast multi-channel tuning and testing of the laser apparatus, as may be useful in tunable transponder DWDM applications.

Figure 7A:
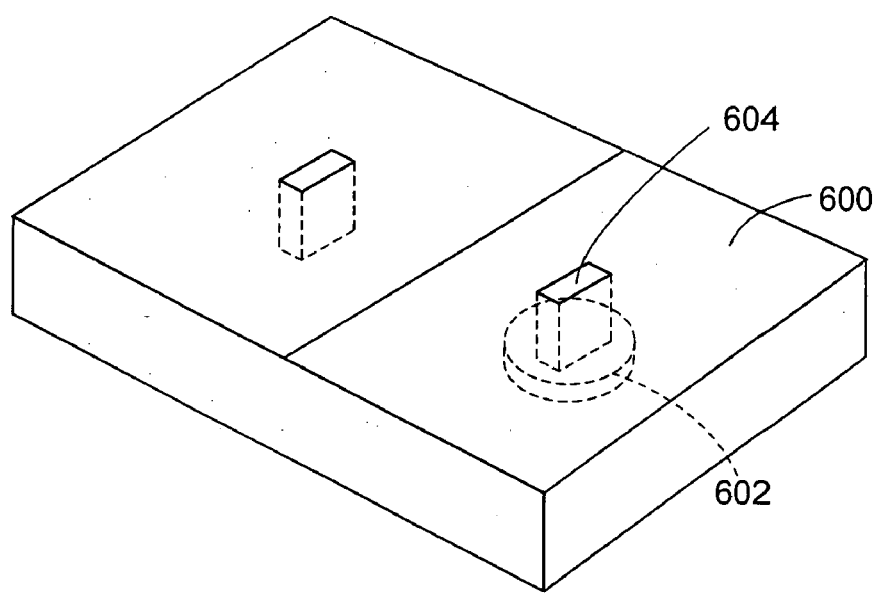
FIGS. 7A and 7B illustrate a portion of a wavelength selection device with mounting supports that may be used during assembly.
Figure 7B:
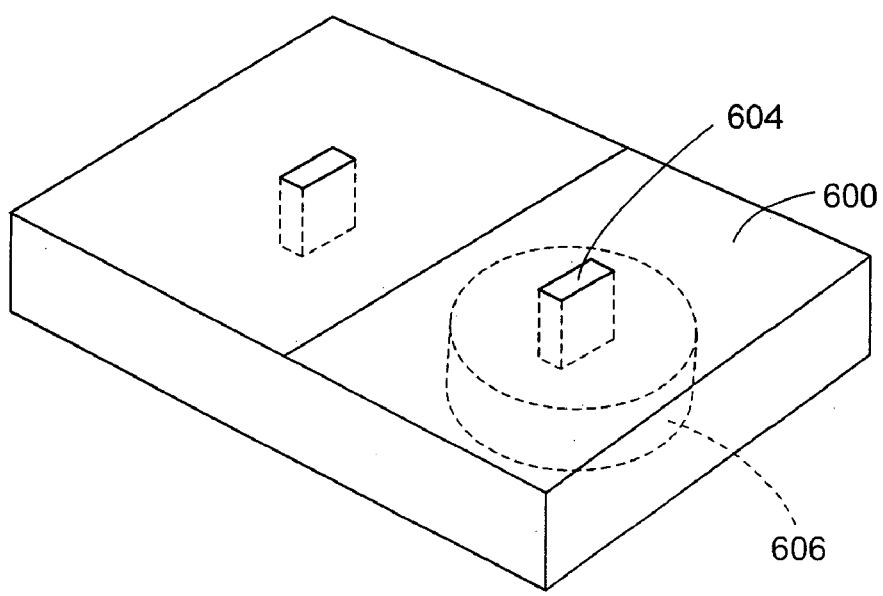

The wavelength selection device may be a hybrid assembly, formed of mounting tunable elements into a micro-hotplate substrate. During mounting of etalons, for example, into a substrate, substantial forces may be applied to the substrate during a pick-and-place assembly. These forces although primarily along the Z-axis and into the substrate may also result in lateral forces along the XY-plane of the substrate. To provide additional support during assembly, a substrate may be supported by a localized mounting structure that provides an equal and opposite force to that applied to the substrate during assembly and that prevents substantial amounts of lateral force transfers from the Z-axis insertion force. For example, FIG. 7A shows a mounting structure 602 positioned below a substrate 600, opposite a recess 604 formed therein. FIG. 7B shows another example mounting structure 606 opposite the recess 604. The supports of FIGS. 7A and 7B may be permanent fixtures that minimize tensile strain during mechanical attachment of the etalons. Alternatively, the mechanical supports may be implemented in tooling to temporarily provide support during attachment of the etalons during assembly.

The mounting structures 604 and 606 are cylindrical in the illustrated example, and are able to counter the load compression load without transferring detrimental lateral forces, which can more easily harm the substrate, due to its lattice orientation and differential between compression and later mechanical strength. Although shown as cylindrical in shape, the shape of the mounting structures are not limited thereto.

During tuning of existing laser apparatus, a TEC could be used for thermal frequency tuning, but that tuning would affect all components on the TEC, including the laser source, end mirror, and the wavelength selection device. The laser apparatus 110 provides an example where etalon tuning may be isolated from such TEC tuning, for example, by forming the thermally responsive substrate to be thick enough to isolate a heating plane of the substrate from the undersurface TEC. Additional isolation of laser apparatus components to allow for detangle tuning and operation are also contemplated. FIG. 8 for example illustrates a laser apparatus 700, having a laser source 702, a wavelength selection component 704, and an end mirror 706 all mounted on a platform 708 and TEC 710 similar to that described above with respect to laser apparatus 110. The apparatus 700, however, includes an active optical path length adjustment element 712 that may be thermo-optically tuned independent of the component 704 or the TEC 710 to allow for detangled, or non-interdependent, frequency tuning of the laser. The optical path length adjustment element 712 may be an optical spacer (as shown), optical wedge, prism, lens, or other optical element. Unlike conventional systems, which use voltage controllable devices or other inducing elements, the optical path length adjustment element 712 may be a thermally, mechanically, or electrically tunable mechanism, capable of frequency tuning, e.g., over the range of channel wavelengths in a DWDM system. Via separate heating or cooling, for example, the element 712 may actively adjust or control the external cavity optical path length for full frequency tuning.

A few example formulations will now be discussed. The tuning rate for silicon, in the telecom C-band, is about ~10 GHz/K. This rate of change is driven by the thermo-optic coefficient (dn/dT) primarily, with a small contribution (for silicon) from the CTE. The fractional change of the optical path length may be expressed by d(OPL)/OPL equaling (1/n)dn/dT+CTE. The temperature change necessary to hop between Vernier channels also depends on Joint Free Spectral Range (JFSR) and average free spectral range chosen when specifying the pair of etalons. For an example, a JFSR of 8.25 THz and an average free spectral range of 275 GHz, a temperature rise of 275 GHz/(10 GHz/K)=27.5 K could be used to address any channel within the JFSR (design tuning range), and a change in the temperature difference between the two etalons of ~27.5 K/8.3 THz/275 GHz)=0.917 K.

Focusing on the optical path length adjust, without temperature influence, the following formula may be used to lock a laser based on changes to the optical path length:

$$\Delta L_{opl} = -(v/f) * L_{opl},$$

where $L_{opl}$ is optical pathlength of the external cavity laser, f is the lasing frequency, and v is the cavity mode spacing. For example, for $L_{opl}$=0.015 m, f=195 THz, v=10 GHz, then hopping from one cavity mode to the other while tuning laser requires adjusting optical pathlength $\Delta L_{opl}$=0.0000077 m, or about 8 μm.

In the illustrated example, the element 712 is an optical spacer having a first optical surface 714 and a second optical surface 716, which each may be coated with an AR coating to prevent internal reflections within the element 712. Additionally or separately, the element 712 may be tilted about the Z-axis and/or rotated in the XY-plane approximately 1° to 2° to reduce the spatial overlap of the reflection and hence the consequential spectral fringes measured in a single (spatial) mode waveguide. Further, although the element 712 is shown with parallel surfaces, alternatively it may have a wedge shape to reduce angular overlap of the fringes and likewise reduce spectral fringes. The element 712 may be formed of the same materials as used to form etalons forming the wavelength selection device 704, when etalons are used. For example, as an optical spacer, the element 712 may be formed of silicon, which is transparent over the gain bandwidth or output wavelength range of InGaAs, InGaAsP and other gain media. Other materials include liquid crystal polymers (LCPs), or materials formed of inert, no-hydroscopic materials.

The element 712 may be positioned directly on the platform 708 or mounted via a mount 718. The mount 718 may be formed of a material for thermal isolation or another material for thermal isolation. In some configurations, the element 712 may be an optical spacer with monitoring (or RTD) electrodes 720a, 720b, 722a, 722b and heating electrodes 724a, 724b, 726a, and 726b, as shown in FIG. 9, where the heater and monitoring electrodes may be patterned conductors in different planes, such as used in some example etalon and thermally responsive substrate configurations.

Alternatively, the element 712 may be a thermally conducting optical element disposed within a thermally responsive substrate, similar to the substrate 134. FIG. 10, for example, shows a tuning assembly 800 having a wavelength selection device 802 and a separate optical path length adjustment element 804. The former, in the illustrated example, includes two etalons 806, 808 mounted into recesses of a thermally responsive substrate 810, where the substrate 810 is divided into different thermal regions 812, 814, one for each etalon 806, 808, respectively. The substrate 810 also has a separate thermal region 816 for controlling the temperature of the optical path length adjustment element 804, where the element 804 is also disposed within a recess within the substrate 810. Temperature tuning and control monitoring of the elements 804, 806, and 808 may be achieved via heating and RTD electrodes driven/monitored by wire bond pads (generally shown as) 818, 820, and 822, respectively. FIG. 11 illustrates a laser apparatus, similar to that illustrated in the example of FIG. 8 (and therefore sharing like reference numerals), but with the tuning assembly 800.

The configuration of FIG. 11 thus allows for the wavelength tuning of a laser apparatus not only through the adjustment of the TEC 710, as in current systems, but also through the independent optical path length control using the adjustment component 804. Whereas the entire TEC 710 may act as a large thermal mass that can take many seconds to thermally change, the adjustment component 804 may be an optical spacer or other element with a relatively small thermal mass, and thus a small thermal time constant (below 1 second, for example). This means that the laser apparatus tuning may be achieved without relying on the relatively long TEC tuning, but may be achieved by active tuning of the adjustment component 804. Furthermore, the thermo-optic responsiveness of the component 804 may be chosen such that the same optical path length adjustment achievable via the TEC or other control mechanism, may be achieved via this small thermal mass object. By way of example, not limitation, a 0.3 mm thick silicon optical spacer, experiencing a temperature variation of only 15° C. can achieve the same amount of optical path length adjustment of a typical TEC controlled design. Thus, whereas before, TEC tuning would affect temperature for all components on a platform, (e.g., the laser medium gain, the wavelength selection element, and the end mirror), and thus affect such control variables as optical output power, laser biasing voltage, and optical path length, the introduction of a separate active optical path length adjustment component will allow the optical path length servo control to be separated from the wavelength selection servo control, the laser servo control, as well as the TEC servo control.

Figure 12:
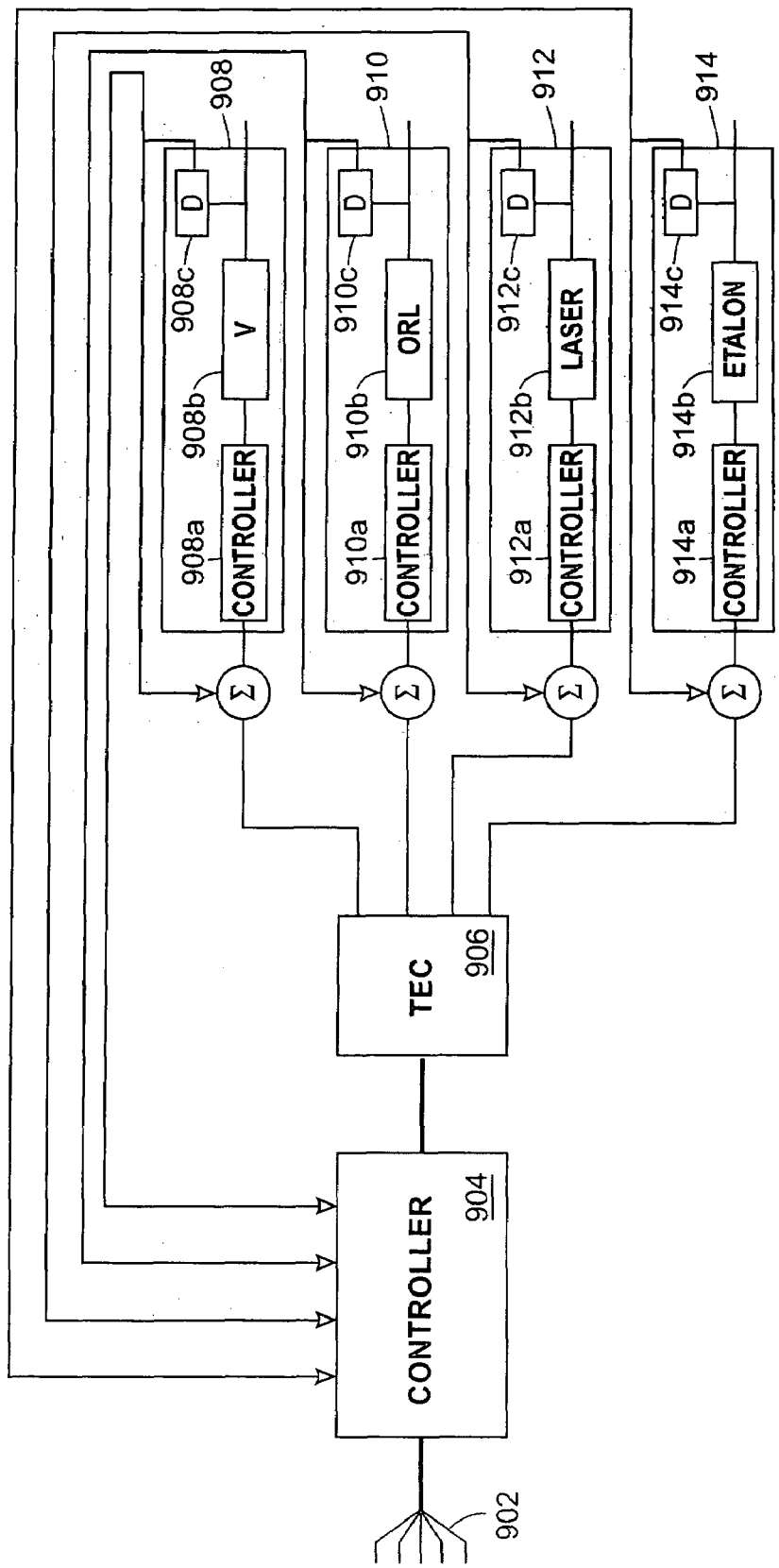
FIG. 12 illustrates an example tuning control where an optical path adjustment device has been separated for independent servo control of frequency tuning.

FIG. 12 illustrates an example tuning control configuration 900 where a series of inputs 902 (shown by example as 5 input values) are provided to a controller 904 which controls a TEC 906, such as those described above. The illustration shows that changes to the TEC 906 can have an effect on numerous different control mechanisms, where these mechanisms may represent individual servo controllable processes. Changes to the TEC 906 may affect a biasing voltage control 908 for the laser source, where for example it is known that the gain of a laser source may be temperature dependent and thus change with TEC changes. The control 908 is shown by example, as having a voltage controller 908a, a voltage source 908b, and a voltage detector 908c. Changes to the TEC 906 could also affect an optical path length control 910 for the laser cavity, for example, by adjusting the optical path length of the waveguide within the laser source. The control 900 includes a controller 910a, one optical path length adjustable component 910b, and a detector 910c. Changes to the TEC 906 could affect the optical power level control 912, which control may attempt to prevent power fluctuations due to thermal changes. The control 912 includes a controller 912a, the laser 912b and a laser output power detector 912c. Further still, changes to the TEC 906 could affect the wavelength selection component control 914, which may include a controller 914a, an etalon tuning element 914b, and a detector 914c.

Each of these controls 910-914 are provided by way of example. It will be understood by persons skilled in the art that the controls can have different configurations, including additional, fewer or other elements. In the illustrated example, the controls 910-914 may provide a feedback to the controller 904, thus representing the interdependence of the TEC control on such values; as the TEC is changed, the static conditions measured by the controls 910-914 may change. The use of a separate active optical path length adjustment component in control 910, however, detangles at least one of the optical path length adjustment control mechanisms (e.g., that of an optical spacer) from TEC tuning. That is, although a TEC may still be adjusted to control for optical path length, with an independently controllable optical path length adjustment device that can achieve frequency tuning, the TEC need not be adjusted during a frequency tuning. Instead, the TEC may be held a constant or relatively constant temperature and the laser apparatus may still achieve frequency tuning via the active frequency tuning optical path length adjustment. With detangling that adjustment, which before had only been used for dithering control and could not perform frequency tuning, a laser apparatus may be capable of frequency tuning at a much faster rate due to the lower thermal mass of the adjusting element. In some examples, the improvements in frequency tuning times may an order of magnitude or more.

Although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalence.

What we claim is:
1. A laser apparatus comprising:
   a platform;
   a gain medium coupled to the platform, the gain medium having a first output facet and a second output facet to emit a light beam from in response to an electrical input;

a reflector positioned to reflect the light beam and coupled to the platform, the reflector and the first output facet defining a laser cavity having an optical path length; and a thermally responsive wavelength selection device positioned within the laser cavity and having a thermally responsive substrate mounted to the platform and a tunable optical element extending from the thermally responsive substrate into the laser cavity to adjust the optical path length in response to a thermal change in the thermally responsive substrate.

2. The laser apparatus of claim 1, wherein the tunable optical element is mechanically mounted for thermal engagement with the thermally responsive substrate.

3. The laser apparatus of claim 1, wherein the tunable optical element comprises a first etalon and a second etalon.

4. The laser apparatus of claim 3, wherein the first etalon is mounted in a first recess in the thermally responsive substrate, and wherein the second etalon is mounted in a second recess in the thermally responsive substrate.

5. The laser apparatus of claim 3, wherein the first etalon is mounted in a first thermal region of the thermally responsive substrate, and wherein the second etalon is mounted in a second thermal region of the thermally responsive substrate, where the first region is thermally isolated from the second region.

6. The laser apparatus of claim 1, wherein the substrate of the thermally responsive wavelength selection device has a heating plane that is different than a laser cavity incidence plane of the tunable optical element.

7. The laser apparatus of claim 6, wherein the heating plane is substantially parallel to an optical axis of the laser cavity, and wherein the incidence plane of the tunable optical element is substantially orthogonal to the heating plane.

8. The laser apparatus of claim 1, wherein the thermally responsive substrate and the tunable optical element have substantially the same coefficient of thermal expansion.

9. The laser apparatus of claim 1, wherein the thermally responsive substrate has a thermal resistance of at least approximately 1200 K/watt.

10. The laser apparatus of claim 1, wherein the thermally responsive wavelength selection device is a first frequency tuning element for the laser apparatus, further comprising an optical path length adjustment device that is a second frequency tuning element for the laser apparatus.

11. The laser apparatus of claim 10, wherein the optical path length adjustment device is mounted to the thermally responsive substrate and thermally isolated from the first frequency tuning element.

12. The laser apparatus of claim 1, wherein the thermally responsive substrate comprises an embedded thermal heater and an embedded temperature monitor.

13. A laser apparatus comprising:
a platform responsive to thermal changes induced in the platform to tune a frequency of an output beam of the laser apparatus;
a gain medium coupled to the platform, the gain medium having a first output facet and a second output facet to emit a light beam from in response to an electrical input;
a reflector positioned to reflect the light beam and coupled to the platform, the reflector and the first output facet defining a laser cavity having an optical path length;
a wavelength selection device positioned within the laser cavity and mounted to the platform for tuning the frequency of the output beam; and an active optical path length adjustment device positioned within the laser cavity and coupled to a controller for tuning the frequency of the output beam in response to thermal changes induced in the optical path length adjustment device independent of the thermal changes induced in the platform to tune the frequency of the output beam.

14. The laser apparatus of claim 13, wherein the active optical path length adjustment device is an optical spacer.

15. The laser apparatus of claim 13, wherein the active optical path length adjustment device includes an embedded heater and an embedded temperature monitor.

16. The laser apparatus of claim 13, wherein the optical path length adjustment device includes a thermally responsive substrate mounted to the platform and a tunable optical element mounted to the thermally responsive substrate to adjust the optical path length in response to thermal changes in the thermally responsive substrate.

17. A method of laser operation comprising:
providing an external cavity laser having a gain medium with a first facet and a second facet for emitting a light beam into a laser cavity having an optical path length; and
positioning a wavelength selection device within the laser cavity, the wavelength selection device having a thermally responsive substrate mounted and a tunable optical element extending from the thermally responsive substrate into the laser cavity to adjust the optical path length in response to a thermal change in the thermally responsive substrate.

18. The method of laser operation of claim 17, further comprising mounting the tunable optical element to extend at least partially into the thermally responsive substrate.

19. The method of laser operation of claim 18, wherein the tunable optical element comprises a first etalon and a second etalon, the method further comprising:
mounting the first etalon in a first recess within the substrate; and
mounting the second etalon in a second recess within the substrate.

20. The method of laser operation of claim 19, further comprising thermally isolating the first etalon from the second etalon.

21. The method of claim 17, further comprising:
disposing a heater element in the thermally responsive substrate; and
disposing a temperature monitor element in the thermally responsive substrate.

22. The method of laser operation of claim 17, further comprising:
positioning a heating plane of the thermally responsive substrate substantially parallel to an optical axis of the laser cavity; and
positioning an incidence plane of the tunable optical element substantially orthogonal to the heating plane.

23. The method of laser operation of claim 17, wherein the wavelength selection device is a primary thermal tuning device of the laser apparatus, the method further comprising:
positioning an optical path length adjustment device in the laser cavity, wherein the optical path length adjustment device is an active, thermo-optically controllable device; and
thermally isolating the optical path length adjustment device from the primary thermal tuning device.

* * * * *